United States Patent [19]
Kim

[11] Patent Number: 5,926,009
[45] Date of Patent: *Jul. 20, 1999

[54] VOLTAGE MONITORING CIRCUIT IN AN INTEGRATED CIRCUIT

[75] Inventor: Jong-Sun Kim, Seongnam, Rep. of Korea

[73] Assignee: Samsung Electronics, Co., Ltd., Suwon, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/859,999

[22] Filed: May 21, 1997

[30] Foreign Application Priority Data

May 31, 1996 [KR] Rep. of Korea ...................... 96-19228

[51] Int. Cl.$^6$ ................................. H02J 7/12; G05F 1/40
[52] U.S. Cl. .......................... 320/166; 323/284; 323/314; 323/316
[58] Field of Search ............................. 320/166; 323/283, 323/284, 274, 314, 315, 316; 327/546

[56] References Cited

U.S. PATENT DOCUMENTS 5,264,780  11/1993  Bruer et al. .............................. 323/222
5,367,247  11/1994  Blocher et al. .......................... 323/222
5,440,263   8/1995  Fournel et al. .......................... 327/546

FOREIGN PATENT DOCUMENTS 59-150347   8/1984   Japan .

*Primary Examiner*—Peter S. Wong
*Assistant Examiner*—Gregory J Toatley, Jr.
*Attorney, Agent, or Firm*—Marger Johnson & McCollom, P.C.

[57] ABSTRACT

A voltage watching circuit including a external supply voltage receiver for being charged by an external supply voltage to produce a charged voltage, a watched voltage detecting section for inverting its output if the charged voltage provided from the external supply voltage receiver reaches a predetermined level, a latch section for latching an output of the watched voltage detecting section, and a reset section for resetting the latch section until the charged voltage of the external supply voltage receiver reaches the predetermined level. According to the circuit, the voltage watching with a proper voltage level is possible regardless of the variation of the temperature and process parameters, and a low power-consumption is achieved.

9 Claims, 8 Drawing Sheets

VOLTAGE MONITORING CIRCUIT IN AN INTEGRATED CIRCUIT

BACKGROUND OF THE INVENTION

The present invention relates generally to a voltage monitoring circuit, and in particular, to a voltage monitoring circuit in a semiconductor device.

Generally, in an integrated circuit, a supply voltage to the individual parts of the circuit reaches a proper voltage level only after a transient period. During such a transient period, a low supply voltage at a value less than the proper voltage level is typically blocked from being supplied to the internal circuit to prevent any malfunction of the internal circuit.

A conventional voltage monitoring circuit, as shown in FIG. 1, generally includes a external supply voltage receiver 10 which is charged by an external supply voltage to produce a charged voltage. This voltage is input to a watched voltage detecting section 20, which inverts its output if the charged voltage of the external supply voltage receiver 10 reaches a predetermined level. An inverter 30 inverts the output signal of the watched voltage detecting section 20.

In the conventional circuit of FIG. 1, when the external supply voltage is switched on, a P-type metal oxide semiconductor (PMOS) transistor 12 in the external supply voltage receiver 10 is turned on, and thus a capacitor 14, connected to a first node N1, begins to be charged. As the capacitor 14 is charged, a voltage level going high at the first node N1. When this N1 voltage reaches a trip point, a PMOS transistor 22 and an N-type metal oxide semiconductor (NMOS) transistor 24 in the voltage detecting section 20 are tripped. Then, the voltage level of a second node N2 shifts from an initial high to a low level, which causes the output φVCCH to shift from an initial low to a high level.

The timing of the output inversion is determined by the resistance value of the PMOS transistor 12 acting as a diode, the capacitance value of the capacitor 14, and the adjustment of the trip points of the voltage detection section 20 and the inverter 30.

However, the conventional voltage monitoring circuit as described above may malfunction due to the output φVCCH of the inverter 30 being shifted at a lower voltage level than desired. The lower voltage level can be caused by a transient delay between supply voltage and the voltage actually realized at the first node N1.

Also, the shift point of the output of the inverter 30, which is the detected voltage level, is restricted to a threshold voltage level Vt of the NMOS transistor 24 of the detecting section 30. Therefore, it is impossible to trigger the shift of the output in this circuit at a higher voltage level than the threshold voltage.

FIG. 2 is a schematic circuit diagram of another conventional voltage monitoring circuit which is constructed to heighten the detected level of the monitored voltage in comparison to the voltage monitoring circuit of FIG. 1. Referring to FIG. 2, the circuit further comprises a watched voltage adjusting section 50 coupled between the source of an NMOS transistor 44 of the voltage detecting section 40 and ground.

The watched voltage adjusting section 50 comprises an NMOS transistor 52 whose gate and drain are connected to each other so as to act as a diode. The watched voltage adjusting section 50 operates to raise the trip point of the inverter as high as the threshold voltage Vt of the NMOS transistor 52.

FIG. 3 is a schematic circuit diagram of still another conventional voltage monitoring circuit which comprises a voltage detecting section 60 including n stages of inverters, and a detected voltage adjusting section 70 with n-1 adjusting stages coupled between the respective inverter stages and ground. In the multi-stage detected voltage adjusting section 70, as the ordinal number of the inverter stages increases, the number of diodes connected to each successive inverter decreases proceeding toward the final inverter stage 52, which lacks any adjusting stage or diode altogether.

One disadvantage of the voltage monitoring circuit of FIG. 3 is that as the power is 20 repeatedly switched on and off, the second and third nodes N2 and N3 in the inverter stages 62, 64 and 66, 68 tend to discharge to the threshold voltage level Vt of "1" V rather than to a "0" V. This effect causes the other inverters to weakly switch on, creating a DC current path between the supply voltage and ground. Thus, the FIG. 3 circuit suffers unnecessary power consumption.

Further, in order to raise the shifting point of the second node N2 as much as n times the threshold voltage Vt, n-1 added stages of inverters are required, which results in circuit complexity and the increase of the layout area. Also, the shifting point of the inverter's output is easily affected by a temperature change due to the sensitive nature of the diodes.

Accordingly, a need remains for a voltage monitoring circuit for adjusting the actual voltage level to a proper level while maintaining stable circuit characteristics against the varying environment, such as temperature change and process parameters and low power consumption parameters.

SUMMARY OF THE INVENTION

The voltage monitoring circuit of the present invention includes a for storing voltage from a transition of the external supply voltage; a voltage detecting means that produces an output and inverts it if the charged voltage reaches a predetermined level; a latch means for latching the output of the voltage detecting means; and a reset means for resetting the latch means until the charged voltage of the charging means reaches the predetermined level.

The external supply voltage receiver includes a first PMOS transistor forwardly coupled between the external supply voltage and a first node, and a capacitor coupled between the first node and ground. The external supply voltage receiver can further include a second PMOS transistor reversely coupled between the first node and the external supply voltage, and an NMOS transistor reversely coupled between ground and the first node.

The voltage detecting means includes an NMOS transistor, coupled between a second node and a third node, for being switched in response to the charged voltage of the external supply voltage receiver. The voltage detecting means can further include a plurality of NMOS transistors connected in series between the third node and ground.

The latch means includes a first PMOS transistor, coupled between the external supply voltage and the output of the voltage detecting means, for switching in response to the output of the latch means. The latch means can further include a second PMOS transistor, coupled between the external supply voltage and the output of the latch means, for switching in response to the output of the voltage detecting means.

The reset means includes an inverter for inverting its output if the charged voltage level of the external supply voltage receiver reaches a trip point. The reset means can further include an NMOS transistor, coupled between an output of the latch means and ground, for switching in response to the output of the inverter.

The voltage monitoring circuit according to the present invention may further comprise output buffer means including a first inverter for inverting an output of the latch means, a second inverter for inverting an output of the first inverter, a PMOS transistor reversely coupled between an output node and the external supply voltage, and an NMOS transistor reversely coupled between ground and the output node.

BRIEF DESCRIPTION OF THE DRAWINGS

The above objects, other features, and advantages of the present invention will become more apparent by describing the preferred embodiments thereof with reference to the accompanying drawings, in which.

DETAILED DESCRIPTION OF THE PREFERRED EMBODIMENTS

Figure 1:
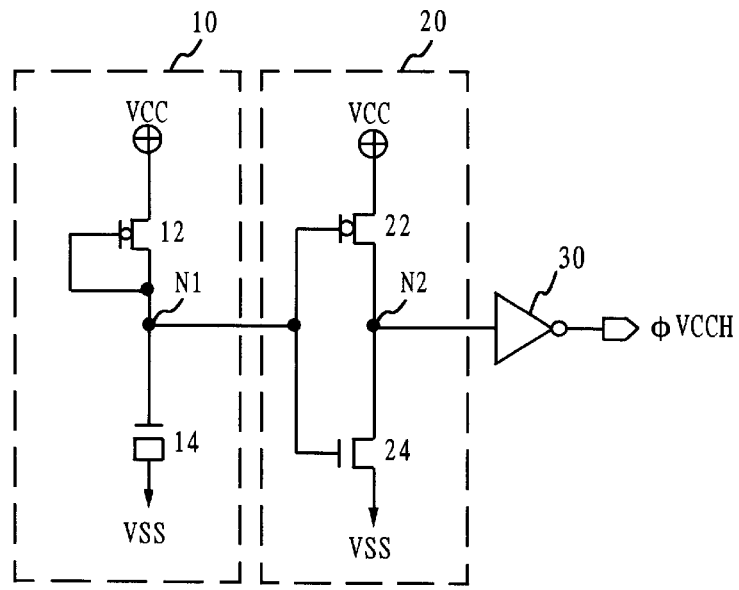
FIG. 1 is a schematic circuit diagram of a conventional voltage monitoring circuit.
Figure 2:
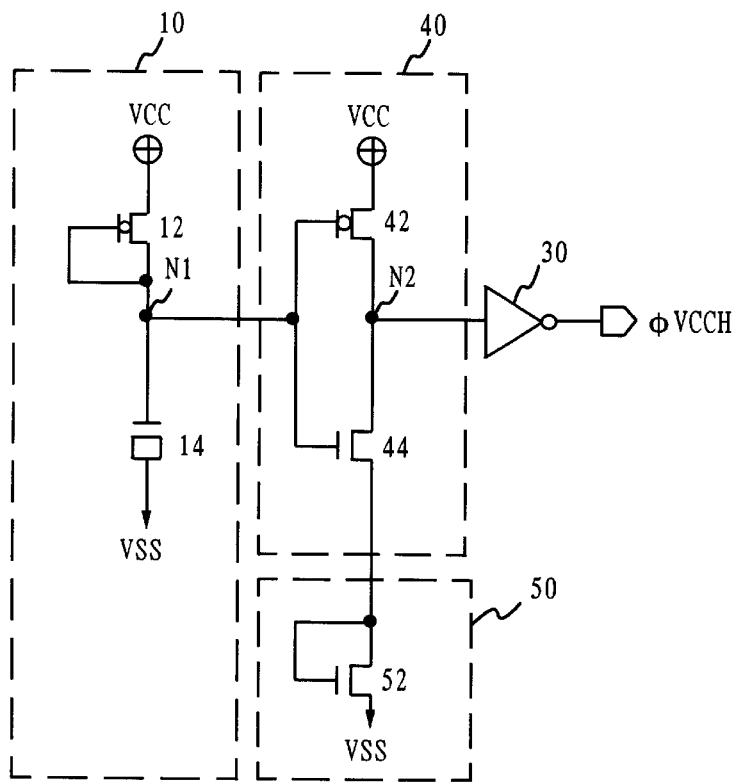
FIG. 2 is a schematic circuit diagram of another conventional voltage monitoring circuit.
Figure 3:
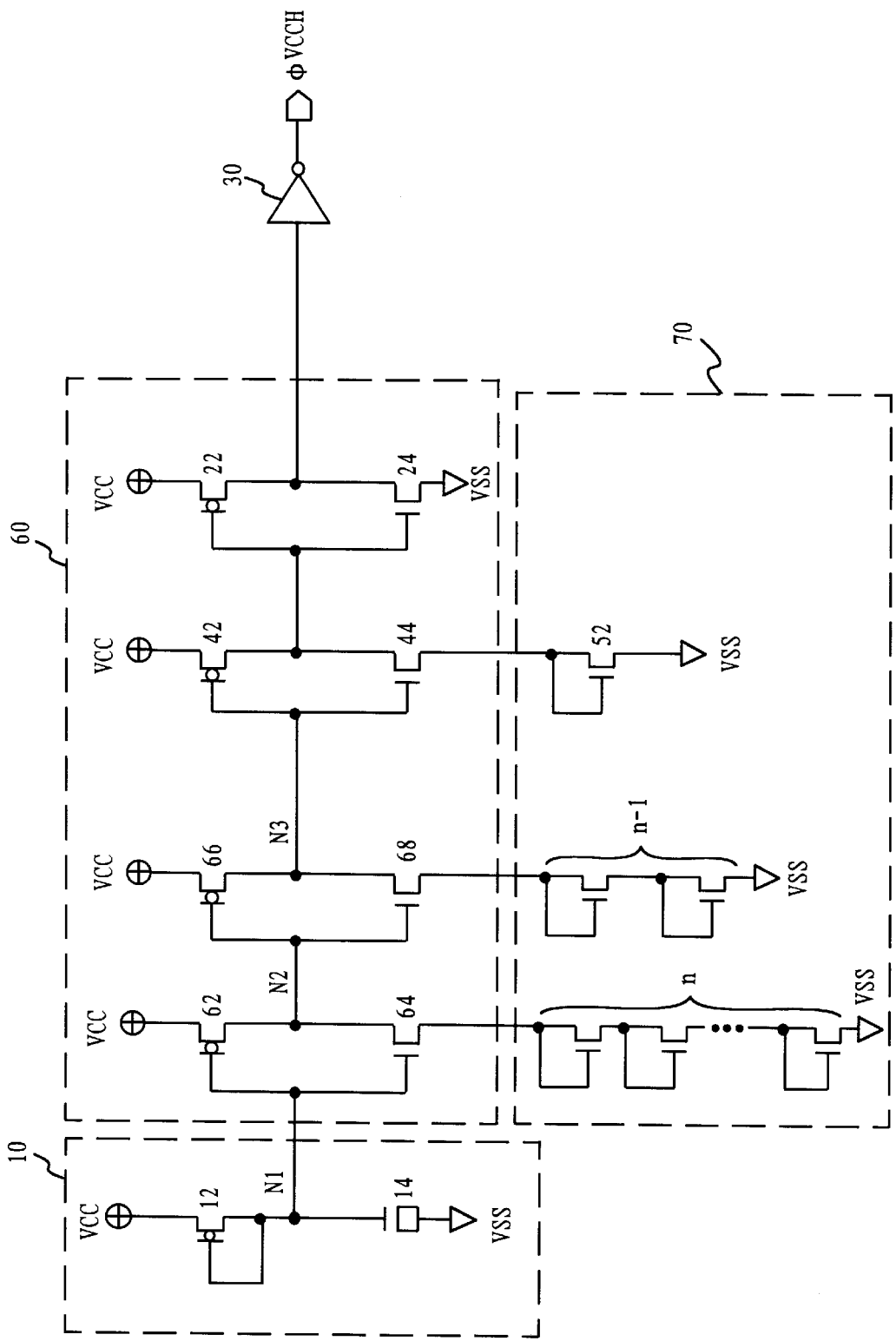
FIG. 3 is a schematic circuit diagram of still another conventional voltage monitoring circuit.
Figure 4:
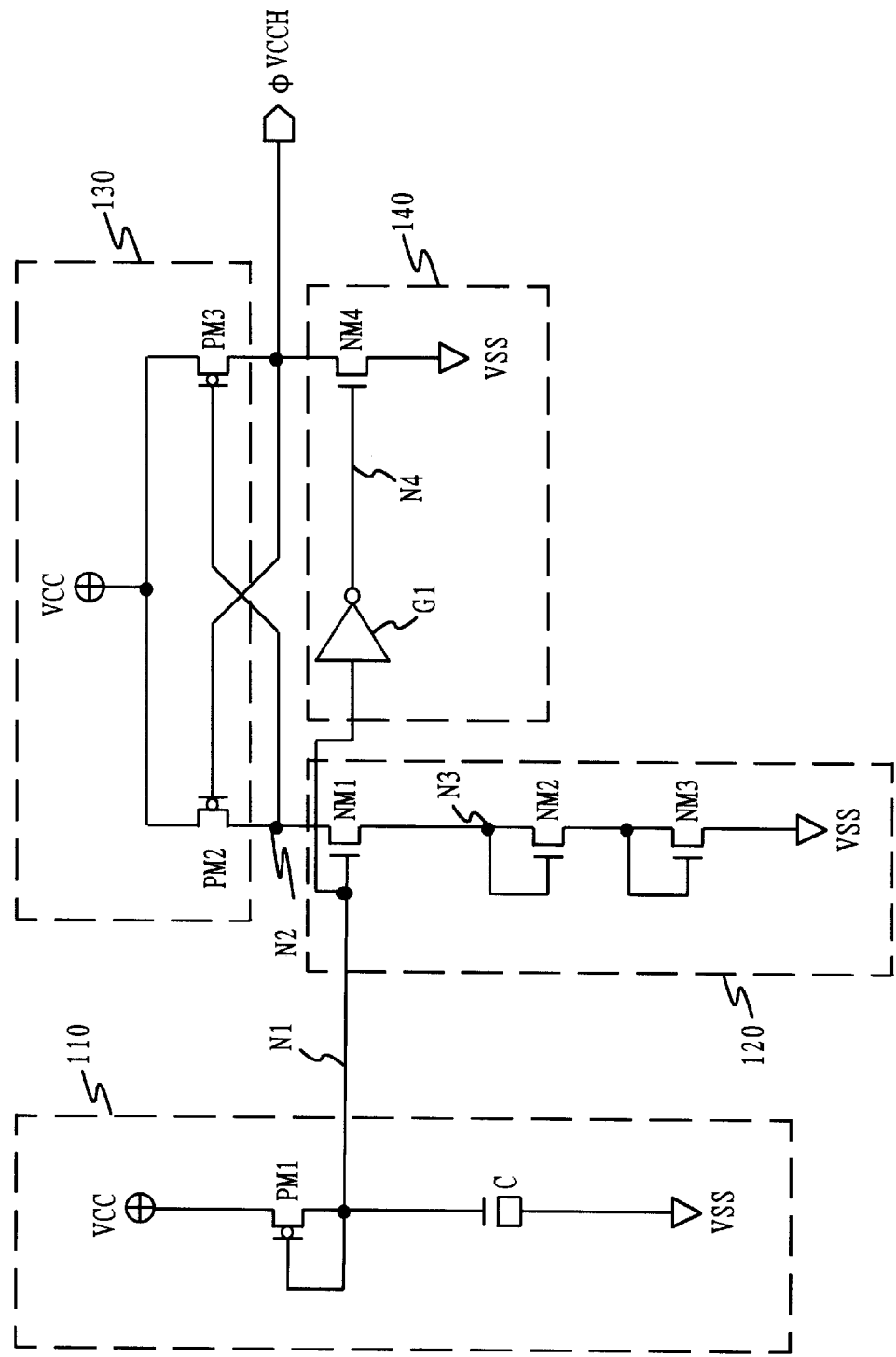
FIG. 4 is a schematic circuit diagram illustrating a preferred structure of the voltage monitoring circuit according to the present invention.

FIG. 4 illustrates a preferred voltage monitoring circuit according to the present invention. Briefly, the voltage monitoring circuit of FIG. 4 includes a external supply voltage receiver 110, a voltage detecting section 120, a latch section 130, and a reset section 140.

The external supply voltage receiver 110 includes a PMOS transistor PM1 forwardly connected between an external supply voltage VCC and a first node N1, and a capacitor C connected between the first node N1 and the ground VSS. The PMOS transistor PM1 is turned off when the difference between the external supply voltage and a charged voltage of the capacitor is below a threshold voltage of the transistor.

The voltage detecting section 120 includes an NMOS transistor NM1, connected between a second node N2 and a third node N3, for switching in response to the charged voltage of the charging section 110. The voltage detecting section 120 can further include one or more diode-connected NMOS transistors NM2 and NM3 connected in series between the third node N3 and the ground VSS to offset the voltage at node N3 relative to VSS by increments of Vt.

In operation, if the charged voltage reaches Vgs(NM1)+2Vt, the NMOS transistor NM1 is turned on, causing the voltage level of the second node N2 to fall from VCC to 2Vt. Accordingly, the actual voltage is determined to be Vgs(NM1)+2Vt. As a result, the actual voltage can be adjusted by the number of the NMOS transistors connected in series between node N3 and ground VSS.

The latch section 130 includes a PMOS transistor PM2, connected between the external supply voltage VCC and the output of the voltage detecting section 120, for switching in response to output φVCCH of the latch section. A PMOS transistor PM3, cross-coupled with transistor PM2, is connected between the external supply voltage VCC and the output of the latch section, for switching in response to the output of the voltage detecting section 120.

Initially, when φVCCH is low, the PMOS transistor PM2 is turned on, causing the voltage level of the second node N2 to become VCC. At the same time, the PMOS transistor PM3 is kept off since the level of the second node N2 is high at VCC. From this state, when the voltage level of the second node N2 falls to Vgs(NM1)+2Vt as determined by the voltage detecting section 120, the PMOS transistor PM3 is switched on. Since φVCCH is now high, the PMOS transistor PM2 is switched off, causing the current flowing through the second node N2 to be cut off and thus avoiding unnecessary power consumption in the voltage detection section 120.

The reset section 140 includes an inverter GI for inverting the charged voltage level of the external supply voltage receiver 110 when the charged voltage reaches a trip point. The reset section 140 further includes an NMOS transistor NM4, connected between the output of the latch section 130 and the ground VSS, for switching in response to the output of the inverter GI at node N4.

For as long as the charged voltage at node N1 does not reach the trip point of the inverter G1(such as 1V) after the supply power is switched on, the voltage level of the fourth node N4 is kept to VCC to cause the NMOS transistor NM4 to conduct. Accordingly, φVCCH is maintained low, causing the latch section 130 to reset. When the charged voltage at node N1 exceeds the trip point of the inverter G1, the fourth node N4 becomes low, and the NMOS transistor NM4 is switched off. Accordingly, when the voltage observed at node N1 becomes Vgs(NM1)+2Vt, the output of the watched voltage detecting section 120 is latched in the latch section 130.

Figure 5:
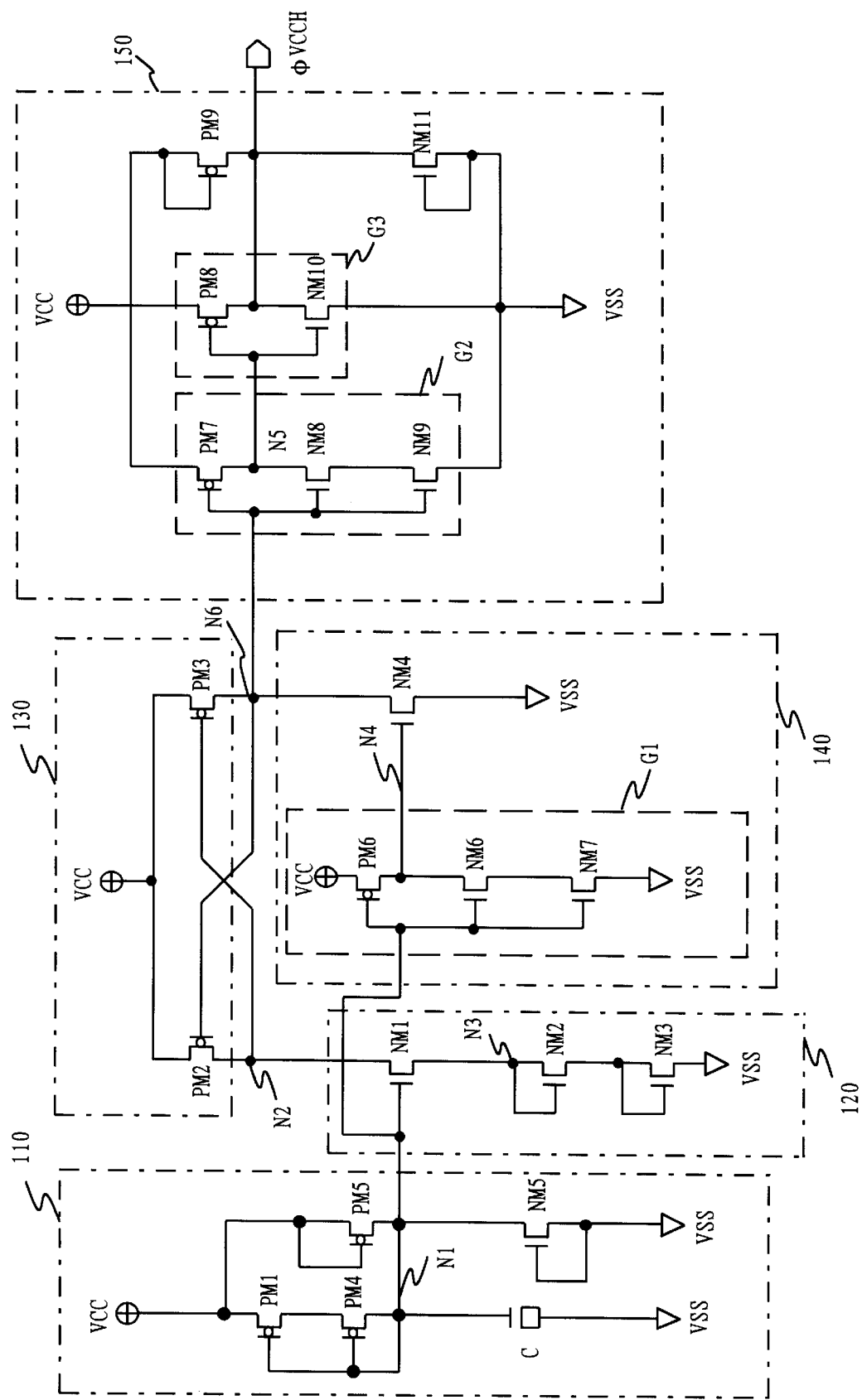
FIG. 5 is a schematic circuit diagram of another embodiment of the voltage monitoring circuit according to a preferred embodiment of the present invention.

FIG. 5 is a schematic circuit diagram of another embodiment of the preferred voltage monitoring circuit according to the present invention. Sections of the circuit and components thereof common to FIGS. 4 and 5 are denoted by like reference numerals. According to this embodiment, the external supply voltage receiver 110 further includes a PMOS transistor PM4 which is coupled between the PMOS transistor PM1 and the first node N1, and whose gate is connected to the first node N1. The external supply voltage receiver 110 further includes a PMOS transistor PM5 reversely coupled between the first node N1 and the external supply voltage VCC, and an NMOS transistor NM5 reversely coupled between the ground VSS and the first node N1.

The PMOS transistor PM5 operates to keep the voltage of the first node N1 at VCC if the voltage level of the first node rises beyond a threshold voltage over VCC. The NMOS transistor NM5 operates to keep the voltage of the first node N1 at VSS if the voltage level of the first node N1 falls below a threshold voltage below VSS. Thus, the device can be protected from the input of an abnormal voltage.

In this embodiment, the inverter G1 includes a PMOS transistor PM6, coupled between the external supply voltage VCC and the fourth node N4, for switching in response to the charged voltage. The inverter G1 further includes one or more NMOS transistors, such as NM6 and NM7, coupled in series between the fourth node N4 and the ground, for simultaneously switching in response to the charged voltage. The inverter G1 as constructed above enables the trip point to be higher than that of a single NMOS transistor.

The voltage watching circuit of FIG. 5 further comprises an output buffer section 150 for buffering the output of the latch section. The output buffer section 150 includes a first inverter G2 for inverting the output of the latch section 130, a second inverter G3 for inverting the output of the first inverter G2, a PMOS transistor PM9 reversely coupled between the output φVCCH and the external supply voltage VCC, and an NMOS transistor NM11 reversely coupled between the ground VSS and the output φVCCH. Here, transistors PM9 and NM11 act as a device protector in the same manner as transistors PM5 and NM5.

The first inverter G2 includes a PMOS transistor PM7, coupled between the external supply voltage VCC and a fifth node N5, for switching in response to the output of the latch section, and one or more NMOS transistors such as NM8 and NM9, coupled in series between the fifth node N5 and the ground VSS, for simultaneously switching in response to the output of the latch section. The second inverter G3 includes a PMOS transistor PM8 and an NMOS transistor NM10.

Now, the operation of the voltage monitoring circuit according to the present invention as constructed above will be explained.

Figure 6A:
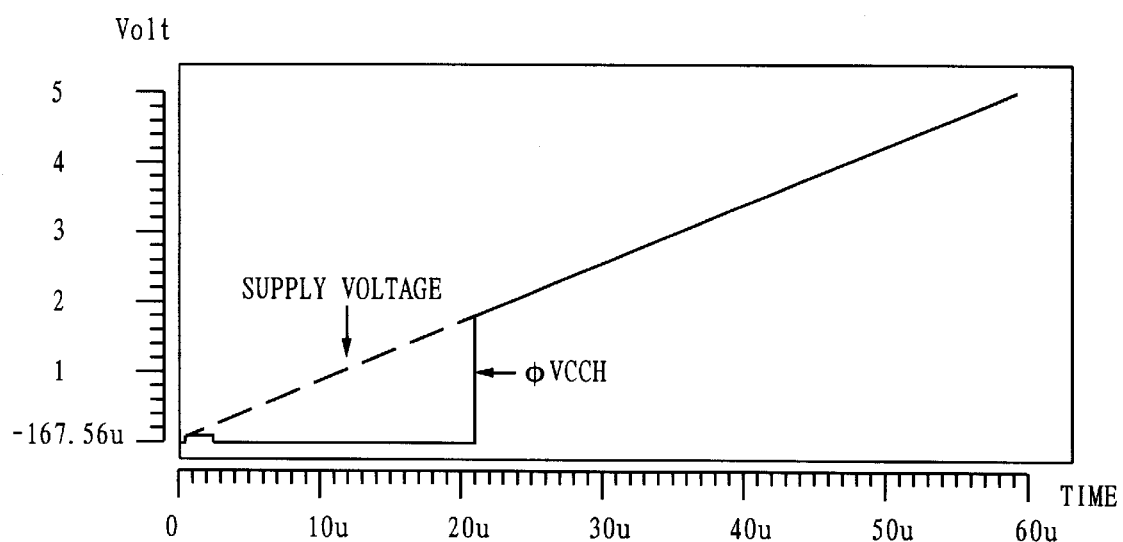
FIGS. 6A to 6C are waveform diagrams depicting the input-output characteristics of the voltage monitoring circuit according to the present invention.
Figure 6B:
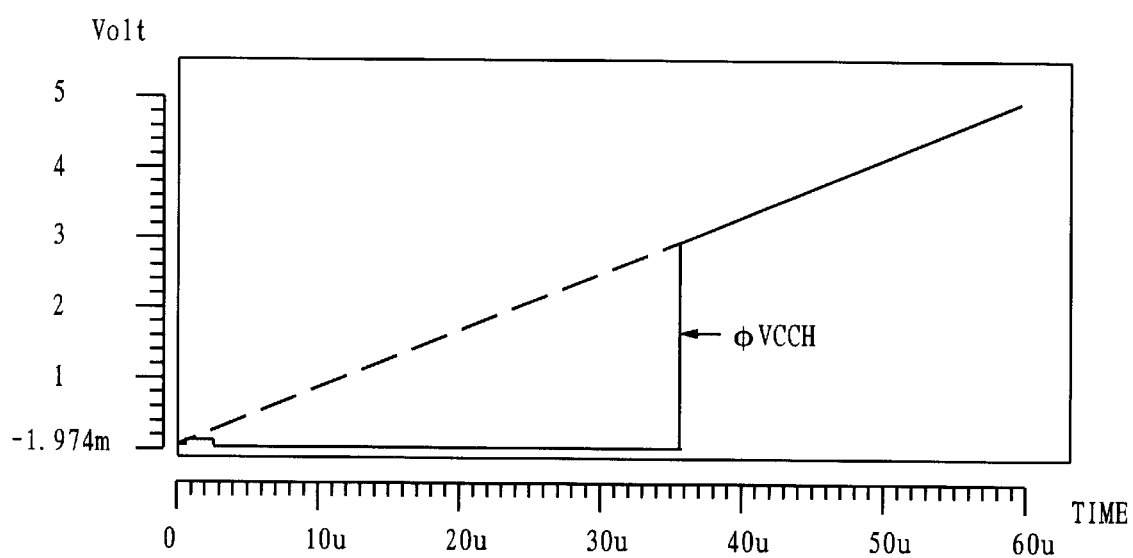
Figure 6C:
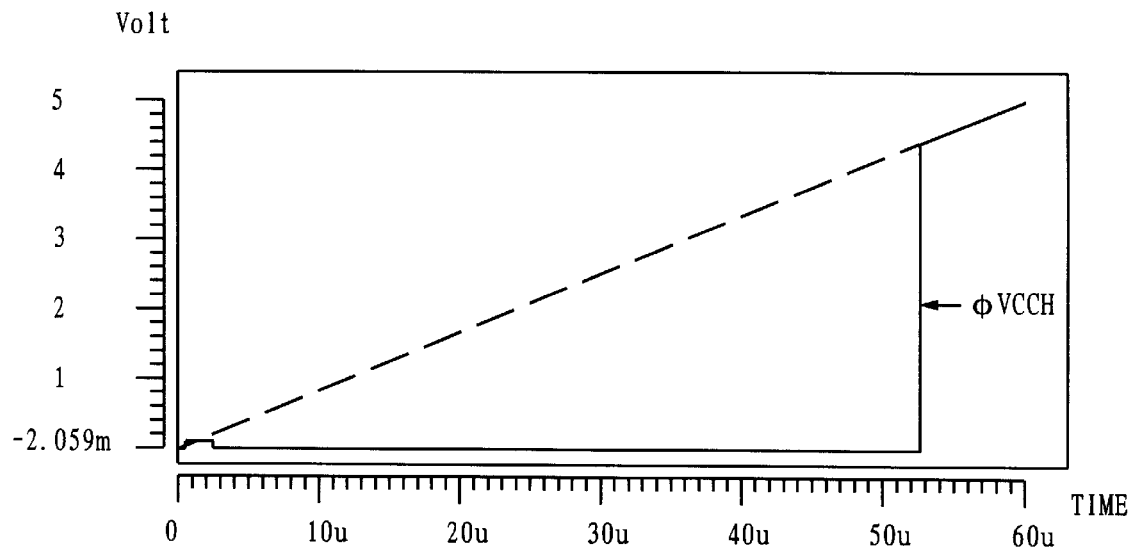
Figure 7A:
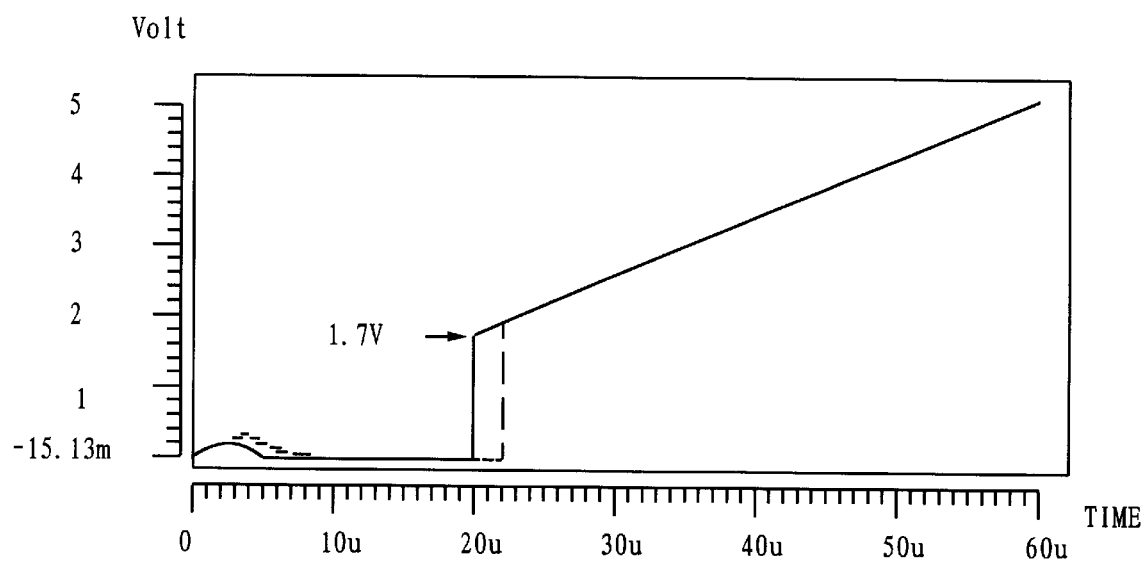
FIGS. 7A and 7B are worst case waveform diagrams of the conventional and present voltage monitoring circuits, respectively, depicting the variation characteristics of the monitored voltage with respect to changes in temperature and process parameters.
Figure 7B:
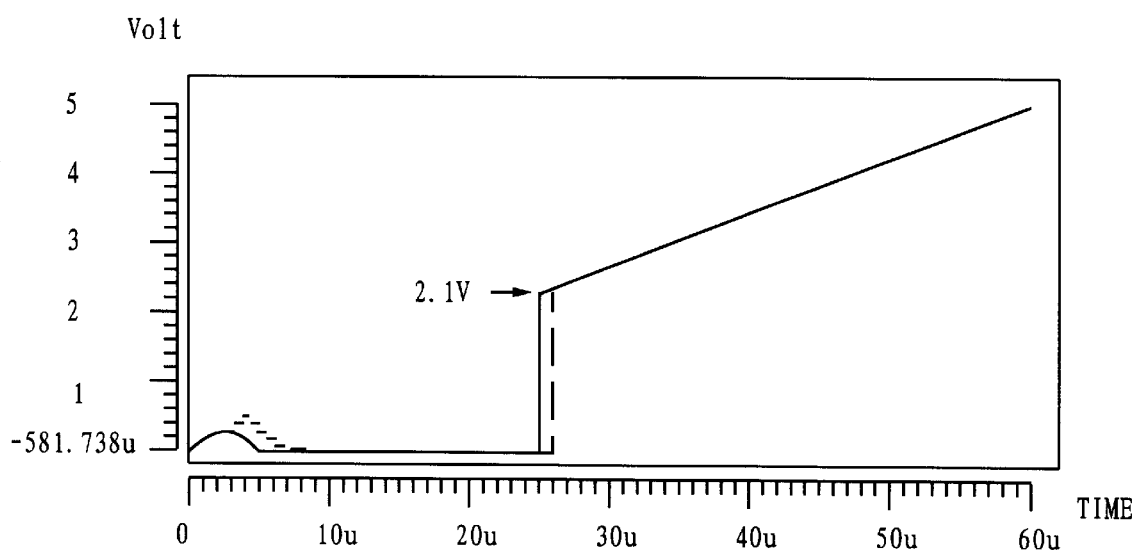

FIGS. 6A to 6C graphically illustrate the observed voltages in which the rising slope of the supply voltage is about 83.3 mV. Specifically, the observed voltage becomes 1.8V if no diode is connected to the third node N3 of the voltage detecting section 120 of the voltage monitoring circuit of the present invention. The observed voltages are between 3V and 4.4V if one or two diodes are connected to the third node N3, respectively.

Figure 8A:
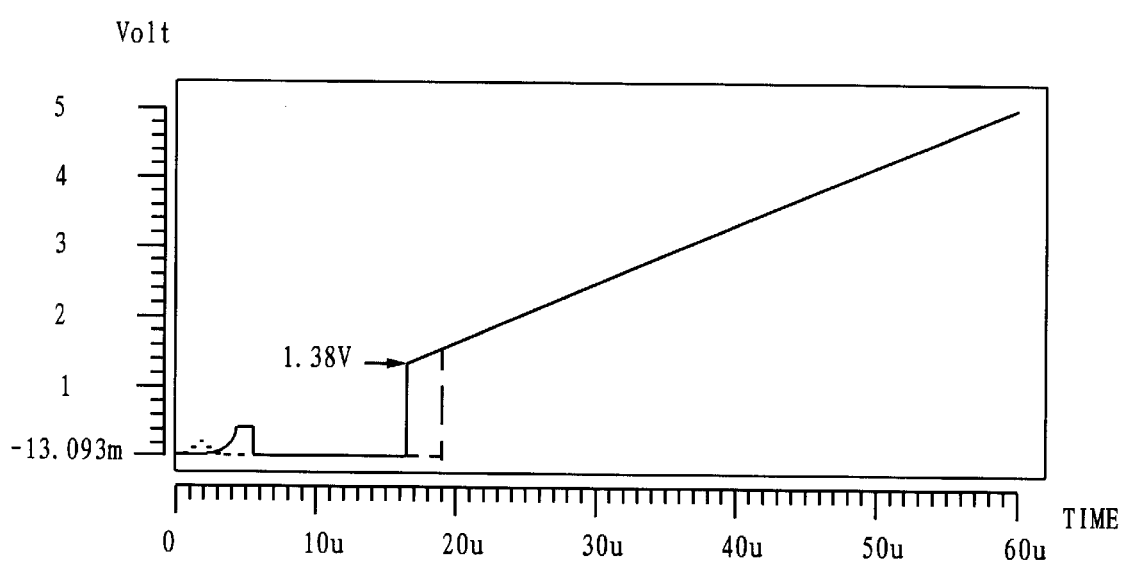
FIGS. 8A and 8B are optimum case waveform diagrams of the conventional and present voltage monitoring circuits, respectively, depicting the variation characteristics of the monitored voltage with respect to changes in temperature and process parameters.
Figure 8B:
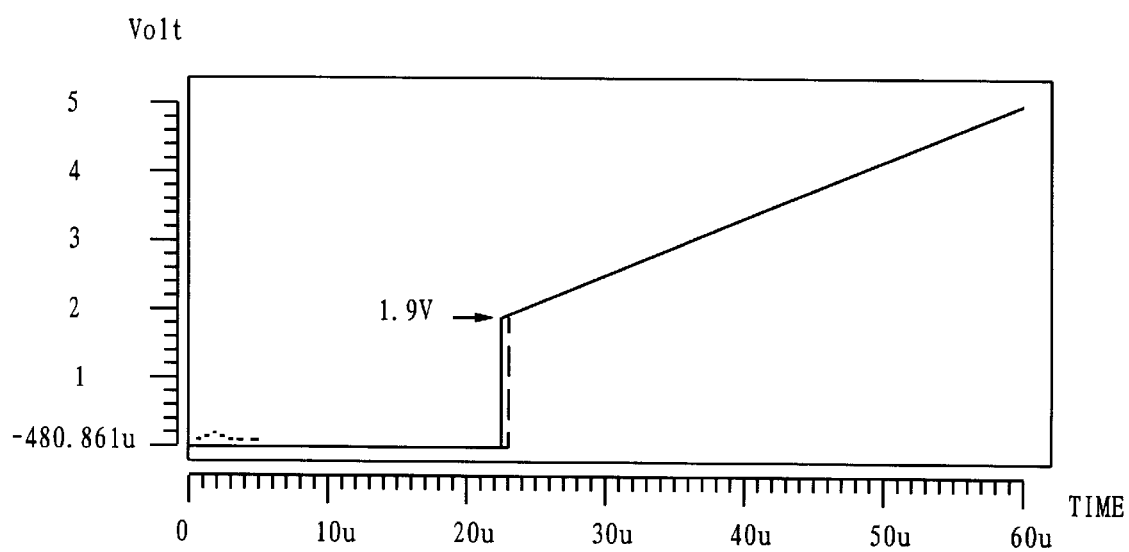

FIGS. 7A and 7B and FIGS. 8A and 8B graphically illustrate the observed voltage variation with respect to process and the temperature in accordance with the conventional and the present voltage watching circuits, respectively. Specifically, the variation range of the watched voltage according to the present invention is very narrow in comparison to that of the conventional circuit, having a wide variation range of the watched voltage both in the most inferior condition (FIGS. 7A and 7B) and in the optimum condition (FIGS. 8A and 8B).

From the foregoing, it will be apparent that the voltage monitoring circuit according to the present invention provides the advantages in that it enables a proper adjustment of the watched voltage in increments of n Vt using a simple construction without the necessity of employing n stages of inverters. Also, the number of diodes to be employed in the respective inverters can be greatly reduced, and this causes the observed voltage variation due to the variation of the temperature and the process to be restrained, resulting in stable operation characteristics. Further, according to the present invention, a low power consumption can be achieved since the power is consumed only during the switching operation, and thus the DC current path is cut off in all states except for the switching operation.

While the present invention has been described and illustrated herein with reference to the preferred embodiments thereof, it will be understood by those skilled in the art that various changes in form and details may be made therein without departing from the spirit and scope of the invention.

I claim:

1. A voltage watching circuit comprising:
   an external supply voltage receiver for storing charge from an external supply voltage to produce a charged voltage;
   voltage detecting means for producing an output when said charged voltage from said external supply voltage receiver reaches a predetermined level;
   latch means for latching the output of the voltage detecting means; and
   reset means for resetting said latch means until said charged voltage of said external supply voltage receiver reaches said predetermined level,
   wherein said external supply voltage receiver comprises:
   a PMOS transistor forwardly coupled between said external supply voltage and a first node; and
   a capacitor coupled between the first node and ground.

2. A voltage watching circuit as claimed in claim 1 further comprising:
   a PMOS transistor reversely coupled between said first node and said external supply voltage; and
   an NMOS transistor reversely coupled between ground and said first node.

3. A voltage watching circuit comprising:
   an external supply voltage receiver for storing charge from an external supply voltage to produce a charged voltage;
   voltage detecting means for producing an output when said charged voltage from said external supply voltage receiver reaches a predetermined level;
   latch means for latching the output of the voltage detecting means; and
   reset means for resetting said latch means until said charged voltage of said external supply voltage receiver reaches said predetermined level,
   wherein said watched voltage detecting means comprises:
   an NMOS transistor, coupled between a second node and a third node, for being switched in response to said charged voltage of said external supply voltage receiver; and
   at least one NMOS transistor connected in series between said third node and ground.

4. A voltage watching circuit comprising:
   an external supply voltage receiver for storing charge from an external supply voltage to produce a charged voltage;
   voltage detecting means for producing an output when said charged voltage from said external supply voltage receiver reaches a predetermined level;
   latch means for latching the output of the voltage detecting means; and
   reset means for resetting said latch means until said charged voltage of said external supply voltage receiver reaches said predetermined level.

5. A voltage watching circuit as claimed in claim 4, wherein said reset means comprises:
   an inverter for inverting its output if said charged voltage level of said charging means reaches a trip point; and
   an NMOS transistor, coupled between an output of said latch means and ground, for being switched in response to said output of said inverter.

6. A voltage watching circuit as claimed in claim 5, wherein said inverter comprises:

a PMOS transistor, coupled between said external supply voltage and a fourth node, for being switched in response to said charged voltage; and one or more NMOS transistors, coupled in series between said fourth node and ground, for being simultaneously switched in response to said charged voltage.

7. A voltage watching circuit comprising:

an external supply voltage receiver for storing charge from an external supply voltage to produce a charged voltage;

voltage detecting means for producing an output when said charged voltage from said external supply voltage receiver reaches a predetermined level;

latch means for latching the output of the voltage detecting means;

reset means for resetting said latch means until said charged voltage of said external supply voltage receiver reaches said predetermined level; and output buffer means for buffering an output of said latch means.

8. A voltage watching circuit as claimed in claim 7, wherein said output buffer means comprises:

a first inverter for inverting an output of said latch means;

a second inverter for inverting an output of said first inverter;

a PMOS transistor reversely coupled between an output node and said external supply voltage; and an NMOS transistor reversely coupled between ground and said output node.

9. A voltage watching circuit as claimed in claim 7, wherein said first inverter comprises:

a PMOS transistor, coupled between said external supply voltage and a fifth node, for being switched in response to said output of said latch means; and one or more NMOS transistors, coupled in series between said fifth node and ground, for being simultaneously switched in response to said output of said latch means.

\* \* \* \* \*

UNITED STATES PATENT AND TRADEMARK OFFICE
CERTIFICATE OF CORRECTION

PATENT NO.   : 5,926,009
DATED        : July 20, 1999
INVENTOR(S)  : Kim

Page 1 of 1

It is certified that error appears in the above-identified patent and that said Letters Patent is hereby corrected as shown below:

Column 2,
Line 11, "power is 20 repeatedly switched" should read -- power is repeatedly switched --.
Line 32, "includes a" should read -- includes an external supply voltage receiver --.

Column 3,
Line 61, "charging section 110" should read -- external supply voltage receiver 110 --.

Column 4,
Lines 26 and 32, "GI should read -- G1 --.

Column 5,
Line 32, "83.3mV" should read -- 83.3mV/ís --.

Column 6,
Line 59, "level." should read -- level, wherein said latch means comprises:
 a first PMOS transistor, coupled between said external supply voltage and said output of said watched voltage detecting means, for being switched in response to an ouput of said latch ameans; and a
 second PMOS transistor, coupled between said external supply voltage and said output of lsaid latch means, for being switched in response to said output of said watched voltage detecting means. --.

Signed and Sealed this

Twenty-first Day of May, 2002

Attest:

Attesting Officer

JAMES E. ROGAN
Director of the United States Patent and Trademark Office